United States Patent
Takahashi et al.

(10) Patent No.: US 9,533,584 B2
(45) Date of Patent: Jan. 3, 2017

(54) POWER SUPPLY DEGRADATION DETERMINATION APPARATUS

(71) Applicant: HONDA MOTOR CO., LTD., Tokyo (JP)

(72) Inventors: Yusuke Takahashi, Utsunomiya (JP); Tomofumi Abe, Utsunomiya (JP); Kenichi Ishida, Sakura (JP); Kazuyuki Kubo, Dublin, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 726 days.

(21) Appl. No.: 13/867,344

(22) Filed: Apr. 22, 2013

(65) Prior Publication Data

US 2013/0289854 A1 Oct. 31, 2013

(30) Foreign Application Priority Data

Apr. 27, 2012 (JP) .................................. 2012-102593

(51) Int. Cl.
  *B60L 11/18* (2006.01)
  *H02J 7/00* (2006.01)
  *G01R 31/36* (2006.01)

(52) U.S. Cl.
  CPC .......... *B60L 11/1809* (2013.01); *H02J 7/0057* (2013.01); *G01R 31/3662* (2013.01); *G01R 31/3679* (2013.01)

(58) Field of Classification Search
  CPC ............. Y02T 10/7005; Y02T 10/7011; Y02T 10/705; Y02T 10/7016; Y02T 10/7044; Y02T 10/6286; Y02T 10/7055; Y02T 10/7077; Y02T 10/92; B60L 11/1851; B60L 11/1861; B60L 3/0046
  See application file for complete search history.

(56) References Cited

U.S. PATENT DOCUMENTS

2006/0087291 A1* 4/2006 Yamauchi ...................... 320/137
2006/0186890 A1* 8/2006 Iwane et al. .................. 324/426
(Continued)

FOREIGN PATENT DOCUMENTS

CN 1192072 A 9/1998
CN 1366189 A 8/2002
(Continued)

OTHER PUBLICATIONS

Japanese Office Action with English translation, dated Mar. 4, 2014, Application No. 2012-102593, 8 pages.
(Continued)

*Primary Examiner* — Sizo Vilakazi
(74) *Attorney, Agent, or Firm* — Rankin, Hill & Clark LLP (57) ABSTRACT

A power supply degradation determination apparatus which is mounted to the vehicle includes a controller and a DC-DC converter that control execution of a charge phase in which a capacitor capable of accumulating regenerative energy of the vehicle is charged and execution of a discharge phase in which the capacitor is discharged. The controller detects the internal resistance of the capacitor using the difference between the terminal voltage and the open circuit voltage of the capacitor during the execution of the discharge phase and the discharge current thereof, determines whether the internal resistance is a predetermined value or more, and delays the execution start of the discharge phase for a predetermined time when the internal resistance is determined to be the predetermined value or more.

8 Claims, 7 Drawing Sheets

(56) References Cited

U.S. PATENT DOCUMENTS

| | | | |
|---|---|---|---|
| 2007/0188151 A1* | 8/2007 | Yamaguchi | 322/24 |
| 2009/0027056 A1* | 1/2009 | Huang | B60L 11/1857 |
| | | | 324/439 |
| 2009/0195219 A1* | 8/2009 | Morita et al. | 320/162 |
| 2011/0001352 A1* | 1/2011 | Tamura et al. | 307/9.1 |
| 2011/0227540 A1* | 9/2011 | Kanoh et al. | 320/135 |
| 2012/0193988 A1* | 8/2012 | Eschrich | H02J 9/062 |
| | | | 307/66 |

FOREIGN PATENT DOCUMENTS

| | | |
|---|---|---|
| CN | 101243325 A | 8/2008 |
| CN | 101682092 A | 3/2010 |
| CN | 102043132 A | 5/2011 |
| CN | 102237706 A | 11/2011 |
| CN | 102313843 A | 1/2012 |
| CN | 102386457 A | 3/2012 |
| EP | 1167988 A1 | 1/2002 |
| EP | 1650575 A1 | 4/2006 |
| EP | 1819025 A2 | 8/2007 |
| EP | 1870289 A1 | 12/2007 |
| EP | 2352199 A1 | 8/2011 |
| JP | 08-254573 | 10/1996 |
| JP | 09-139236 | 5/1997 |
| JP | 2002-075461 A | 3/2002 |
| JP | 2002-374675 | 12/2002 |
| JP | 2003-244854 | 8/2003 |
| JP | 2011-050229 | 3/2011 |

OTHER PUBLICATIONS

Chinese Office Action with English Translation dated Mar. 16, 2015, 22 pages.
European Search Report dated Jul. 10, 2014, 8 pages.

* cited by examiner

POWER SUPPLY DEGRADATION DETERMINATION APPARATUS

CROSS-REFERENCE TO RELATED APPLICATION

Priority is claimed on Japanese Patent Application No. 2012-102593, filed on Apr. 27, 2012, the content of which is incorporated herein by reference.

BACKGROUND

Field of the Invention

The present invention relates to a power supply degradation determination apparatus.

Description of Related Art

Hitherto, apparatuses have been known in which, for example, an open circuit voltage measured at the time of charge interruption during pulse charging of a secondary battery, or the like is used as a nonresistance voltage, and the amount of charge of the secondary battery is estimated based on the nonresistance voltage (see, for example, Japanese Unexamined Patent Application, First Publication No. H9-139236).

SUMMARY

Incidentally, according to the above-mentioned apparatus in the related art, since an open circuit voltage is measured during the charge interruption, charging is required to be interrupted.

For this reason, for example, when the apparatus is mounted to a vehicle capable of recovering regenerative energy, regenerative energy capable of being recovered is reduced by interrupting charging, and thus a problem of a drop in the fuel efficiency of a vehicle occurs.

Aspects according to the invention is contrived in view of such circumstances, and an object thereof is to provide a power supply degradation determination apparatus which is capable of determining the degradation of a power supply with a high level of accuracy while preventing energy loss.

An aspect according to the present invention includes the following means for achieving the object related to solving the problems.

(1) A power supply degradation determination apparatus according to an aspect of the present invention which is mounted to a vehicle, includes: a battery which is capable of accumulating regenerative energy of the vehicle; a charge and discharge control unit which controls execution of a charge phase in which the battery is charged and a discharge phase in which the battery is discharged; a standby unit which delays an execution start of the discharge phase by the charge and discharge control unit for a predetermined time; and an internal resistance determination unit which determines an internal resistance of the battery, wherein the internal resistance determination unit detects the internal resistance of the battery using a difference between a terminal voltage and an open circuit voltage of the battery during the execution of the discharge phase, and a discharge current of the battery during the execution of the discharge phase, and determines whether the internal resistance is a predetermined value or more, and the standby unit delays the execution start of the discharge phase by the charge and discharge control unit for the predetermined time when the internal resistance is determined to be the predetermined value or more by the internal resistance determination unit.

(2) In the aspect of (1), the standby unit may delay the execution start of the discharge phase for the predetermined time only when the execution of the discharge phase is started within the predetermined time after the execution of the charge phase is terminated in a case where the discharge phase is executed subsequent to the execution of the charge phase by the charge and discharge control unit.

(3) In the aspect of (1) or (2), the standby unit may increase the predetermined time with an increase in the internal resistance detected by the internal resistance determination unit.

(4) In any one of aspects (1) to (3), the standby unit may make the predetermined time when the discharge phase is executed subsequent to the execution of the discharge phase by the charge and discharge control unit longer than the predetermined time when the discharge phase is executed subsequent to the execution of the charge phase by the charge and discharge control unit.

(5) Any one of aspects (1) to (4) may further include a standby prohibition unit which prohibits the execution start of the discharge phase by the charge and discharge control unit from being delayed for the predetermined time by the standby unit until the internal resistance is determined to be the predetermined value or more by the internal resistance determination unit.

(6) In the aspect of (5), the vehicle may be equipped with an internal combustion engine that drives the vehicle, an electric load, and a battery capable of supplying power to the electric load with a predetermined depth of discharge, the charge and discharge control unit may supply power from the battery to the electric load during the execution of the discharge phase, and the charge and discharge control unit may supply power from the battery to the electric load with a depth of discharge smaller than the predetermined depth of discharge, when the internal resistance is determined to be the predetermined value or more by the internal resistance determination unit in a state where standby prohibition by the standby prohibition unit is not executed.

(7) In the aspect of (6), the vehicle may further include an idle stop unit which temporarily stops the internal combustion engine when stop conditions are satisfied and starts the internal combustion engine in a temporary stop state when return conditions are satisfied, the battery may hold power required for starting the internal combustion engine, the idle stop unit may supply the power from the battery to a start-up device of the internal combustion engine based on a return request, and the charge and discharge control unit may make a supply of power from the battery to the electric load smaller when the internal resistance is determined to be the predetermined value or more by the internal resistance determination unit than when the internal resistance is determined to be less than the predetermined value by the internal resistance determination unit.

(8) A power supply degradation determination apparatus according to an aspect of the present invention which is mounted to a vehicle, includes: a battery which is capable of accumulating regenerative energy of the vehicle; a charge and discharge control unit for controlling execution of a charge phase in which the battery is charged and a discharge phase in which the battery is discharged; and an internal resistance determination unit for determining an internal resistance of the battery, wherein the internal resistance determination unit detects the internal resistance of the battery using a difference between a terminal voltage and an open circuit voltage of the battery during the execution of the discharge phase and a discharge current of the battery during the execution of the discharge phase, only when the execution of the discharge phase is started within the predetermined time after the execution of the charge phase is terminated in a case where the discharge phase is executed subsequent to the execution of the charge phase by the charge and discharge control unit and determines whether the internal resistance is the predetermined value or more.

According to the aspect of (1), the execution start of the discharge phase is delayed for the predetermined time with respect to the internal resistance determination unit which detecting the internal resistance of the battery using the difference between the terminal voltage and the open circuit voltage of the battery during the execution of the discharge phase and the discharge current thereof, thereby allowing the internal resistance to be detected with a high level of accuracy in a state where the terminal voltage of the battery is stable.

Furthermore, since the internal resistance is detected by delaying the execution start of the discharge phase, energy (for example, regenerative energy or the like) of the vehicle capable of being recovered as electric energy is prevented from being reduced, for example, as compared to the case where the internal resistance is detected by delaying the execution start of the charge phase, and thus the fuel efficiency of the vehicle can be prevented from dropping.

According to the aspect of (2), in a state where switching from the charge phase to the discharge phase is performed, the difference between the terminal voltage and the open circuit voltage of the battery is large, and the time required for the terminal voltage to stabilize lengthens. Thereby, the internal resistance is easily detected as a higher value than in reality in addition to an increase in a detection error of the internal resistance, and thus the degradation of the battery can be determined too early.

On the other hand, the execution start of the discharge phase is delayed for at least the predetermined time, and standby is performed until the terminal voltage stabilizes so that the difference between the terminal voltage and the open circuit voltage of the battery is made to be small, thereby allowing the detection accuracy of the internal resistance and the reliability of the degradation determination of the battery to be improved.

According to the aspect of (3), the execution start of the discharge phase is prevented from being excessively delayed when the internal resistance is small. Thereby, it is possible to secure a desired supply of power and to prevent the detection accuracy of the internal resistance from dropping when the internal resistance is large.

According to the aspect of (4), it is possible to accurately determine the degradation of the battery.

That is, when the predetermined time required for standby before the execution start of the discharge phase is insufficient in a case where the discharge phase is executed subsequent to the execution of the charge phase, the difference between the terminal voltage and the open circuit voltage of the battery is easily detected as a higher value than in reality, and thus it is easily determined that the battery is degraded.

On the other hand, when the predetermined time required for standby before the execution start of the discharge phase is insufficient in a case where the discharge phase is executed subsequent to the execution of the discharge phase, the difference between the terminal voltage and the open circuit voltage of the battery is easily detected as a lower value than in reality, and thus it is easily determined that the battery is not degraded.

Therefore, when the discharge phase is executed subsequent to the execution of the discharge phase, the degradation of the battery can be prevented from not being detected by making the predetermined time required for standby longer than when the discharge phase is executed subsequent to the execution of the charge phase.

According to the aspect of (5), the execution of standby is omitted with respect to the battery in a low temperature state, for example, during the start of the vehicle, or the like. Thereby, it is possible to perform the execution start of the discharge phase and the determination of the internal resistance early and to prevent the execution start of the discharge phase and the determination of the internal resistance from being delayed unnecessarily.

According to the aspect of (6), the depth of discharge of the battery is reduced with an increase in the internal resistance of the battery, thereby allowing the battery to be prevented from being degraded.

According to the aspect of (7), it is possible to secure the supply of power to the electric load over a desired idle stop time while securing power for starting the internal combustion engine in a stop state.

According to the aspect of (8), in a state where switching from the charge phase to the discharge phase is performed, the difference between the terminal voltage and the open circuit voltage of the battery is large, and the time required for the terminal voltage to stabilize lengthens. Thereby, the internal resistance is easily detected as a higher value than in reality in addition to an increase in a detection error of the internal resistance, and thus the degradation of the battery can be determined early.

DESCRIPTION OF THE EMBODIMENT

Hereinafter, a power supply degradation determination apparatus according to an embodiment of the invention will be described referring to the accompanying drawings.

Figure 1:
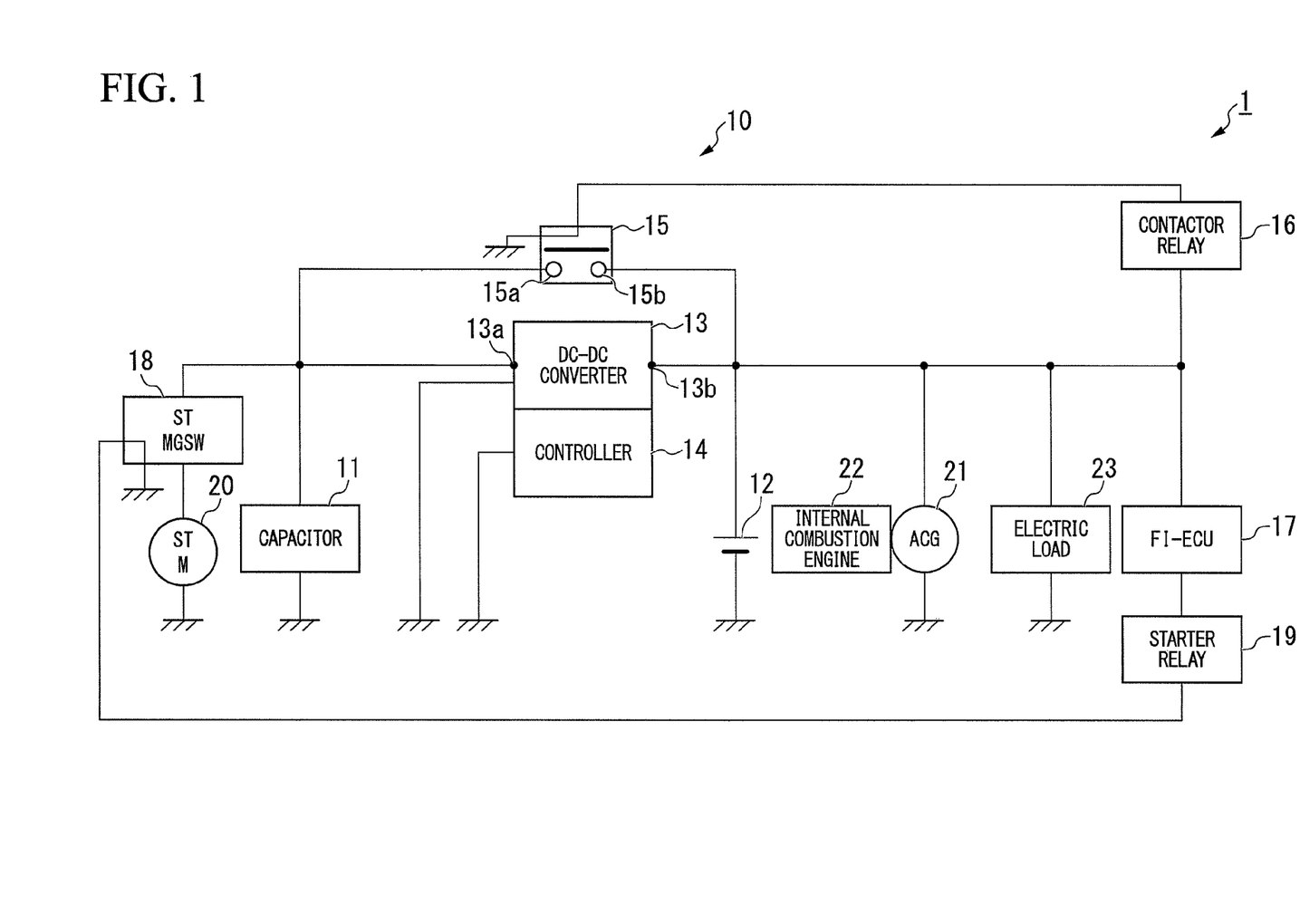
FIG. 1 is a configuration diagram of a vehicle to which a power supply degradation determination apparatus according to an embodiment of the invention is mounted.

For example, as shown in FIG. 1, a power supply degradation determination apparatus 10 according to the present embodiment is mounted to a vehicle 1, and the vehicle 1 is configured to include a capacitor (a battery) 11 and a battery 12 as a secondary battery, a DC-DC converter (a charge and discharge control unit) 13, a controller (the charge and discharge control unit, an internal resistance determination unit, a standby unit, a standby prohibition unit) 14, a contactor 15, a contactor relay 16, an FI-ECU (an idle stop unit) 17, a starter magnet switch 18, a starter relay 19, a starter motor (a start-up device) 20, a generator 21, an internal combustion engine 22, and an electric load 23.

The power supply degradation determination apparatus 10 according to the present embodiment is configured to include, for example, the capacitor 11, the battery 12, the DC-DC converter 13, the controller 14, the contactor 15, and the contactor relay 16.

The capacitor 11 is, for example, an electric double-layer capacitor, an electrolytic capacitor, a lithium ion capacitor or the like, and is connected to the starter magnet switch 18.

In addition, the capacitor 11 is connected to an input and output terminal 13a on one side (for example, high-voltage side) of the DC-DC converter 13, and is capable of being electrically connected to the generator 21 and the electric load 23 through the DC-DC converter 13.

The battery 12 is, for example, a lead battery of a predetermined low voltage (for example, 12 V) or the like, and is connected to the generator 21, the electric load 23, the contactor relay 16, and the FI-ECU 17.

In addition, the battery 12 is connected to an input and output terminal 13b on the other side (for example, low-voltage side) of the DC-DC converter 13, and is capable of being electrically connected to the starter magnet switch 18 through the DC-DC converter 13.

Further, the capacitor 11 and the battery 12 are connected to terminals 15a and 15b of the contactor 15 and are configured to be capable of switching electrical connection and cut-off therebetween by the contactor 15.

The DC-DC converter 13 can be stepped up and stepped down bi-directionally between input and output terminals 13a and 13b, for example, by control of the controller 14.

For example, the DC-DC converter 13 charges the capacitor 11 by supplying generative power generated by the generator 21 to the capacitor 11 during the operation of the internal combustion engine 22 or regenerative power generated by the generator 21 during the braking of the vehicle 1.

In addition, for example, the DC-DC converter 13 discharges the capacitor 11 by supplying power electrically accumulated in the capacitor 11 to the electric load 23.

The controller 14 controls for example, the bi-directional step-up/step-down operation of the DC-DC converter 13 and the operation of the connection and cut-off of the contactor 15 by the contactor relay 16.

In addition, the controller 14 controls, for example, the execution permission and execution prohibition of an idle stop by the FI-ECU 17 and outputs a control command instructing the FI-ECU 17 to permit or prohibit execution of the idle stop.

In addition, the controller 14 detects, for example, the internal resistance and capacitance of the capacitor 11. The controller determines whether the internal resistance is a predetermined value or more, and determines the degradation of the capacitor 11 based on the internal resistance.

For this reason, the controller 14 includes, for example, a voltage sensor that detects the terminal voltage of the capacitor 11, a current sensor that detects the charge current and discharge current of the capacitor 11, and a temperature sensor that detects the temperature of the capacitor 11.

In addition, the controller 14 controls, for example, the discharge of the battery 12 and the depth of discharge of the battery 12 caused by the supply of power from the battery 12 to the electric load 23.

The contactor 15 switches, for example, the connection and cut-off between terminals 15a and 15b of the contactor 15 based on the "On"/"Off" operation of the contactor relay 16, and the "On"/"Off" operation of the contactor relay 16 are controlled, for example, by the controller 14.

In addition, the one terminal 15a of the contactor 15 is connected to, for example, a terminal on a positive electrode side of the capacitor 11 and the starter magnet switch 18.

In addition, the other terminal 15b of the contactor 15 is connected to, for example, a terminal on a positive electrode side of the battery 12.

Thereby, in the connection state of the contactor 15, the capacitor 11 and the battery 12 are connected in parallel with the starter magnet switch 18 and the starter motor 20 which are connected in series with each other.

The FI-ECU 17 is, for example, an ECU (Electronic Control Unit) constituted by electronic circuits such as a CPU (Central Processing Unit) and performs various types of control on the operations of the internal combustion engine 22 such as fuel supply and ignition timing.

For example, the FI-ECU 17 controls the start and stop of the internal combustion engine 22 by a start request and a stop request based on a signal which is output from an ignition switch operated by a driver. Further, the FI-ECU automatically temporarily stops the internal combustion engine 22 in an operating state when stop conditions are satisfied, and controls an idle stop for automatically restarting the internal combustion engine 22 in a temporary stop state when return conditions are satisfied.

In addition, the stop conditions correspond to, for example, a case where the vehicle speed of the vehicle 1 is zero, a case where the opening degree of an accelerator pedal is zero, and a case where a brake pedal switch is turned on, and the like, and the return conditions correspond to, for example, a case where the brake pedal switch is turned off, and the like.

In addition, the internal combustion engine 22 is started by, for example, a driving force of the starter motor (STM) 20, and the starter motor 20 is rotationally driven by the application of a voltage from the capacitor 11 or the battery 12 through the starter magnet switch (STMGSW) 18.

The starter magnet switch 18 switches, for example, the presence or absence of the supply of power to the starter motor 20 based on the "On"/"Off" operation of the starter relay 19, and the "On"/"Off" operation of the starter relay 19 is controlled by, for example, the FI-ECU 17.

For example, the FI-ECU 17 starts the internal combustion engine 22 by controlling the starter relay 19 so as to be turned on according to a start request based on a signal which is output from the ignition switch or a return request from a temporary stop state of the idle stop.

In addition, for example, the FI-ECU 17 controls a generation operation of the generator (ACG) 21, and arbitrarily changes a generation voltage of the generator 21.

In addition, the generator 21 is, for example, an AC generator coupled to a crank shaft of the internal combustion engine 22 through a belt or the like, and outputs regenerative power by generating power through motive power of the internal combustion engine 22 during the operation of the internal combustion engine 22, and outputting generative power, or converting kinetic energy of a car body transmitted from driving wheels during the deceleration of the vehicle 1, during running in a stop state for fuel supply, or the like, into electric energy (regenerative energy).

In addition, the generator 21 includes a rectifier that rectifies an AC output by generation and regeneration to a DC output.

The electric load 23 is, for example, various types of auxiliary equipment mounted to the vehicle 1, and the like.

The power supply degradation determination apparatus 10 according to the present embodiment includes the above-mentioned configuration. Next, operations of the power supply degradation determination apparatus 10 will be described.

In the vehicle 1, as shown in Table 1 below, for example, seven operating modes are set as charge and discharge operations of the capacitor 11 and the battery 12 based on the driving of the vehicle 1.

TABLE 1

| Operating mode | Operating detail |
| --- | --- |
| M1: initial start | Starter ON |
| M2: I/S readiness charge | Charge to capacitor in preparation for I/S |
| M3: regeneration charge | Charge to capacitor during regeneration |
| M4: regeneration discharge | Discharge regenerative power and halt ACG |
| M5: I/S supply of power (capacitor) | Discharge from capacitor to electric load during I/S |
| M6: I/S supply of power | Supply of power from battery to electric load |
| M7: ENG restart | Discharge from capacitor and restart |

First, an operating mode M1 of initial start is an operating mode in which the internal combustion engine 22 is started by a start request based on a signal which is output from the ignition switch. In this mode, the supply of power to the starter motor 20 through the starter magnet switch 18 is started by the "On" operation of the starter relay 19, and the internal combustion engine 22 is started by a driving force of the starter motor 20.

In this case, it is likely that power required for the start of the internal combustion engine 22 will not be able to be supplied, for example, due to a drop in the remaining capacity SOC of the capacitor 11 to less than a predetermined value, or a drop in the temperature of the capacitor 11 to less than a predetermined temperature.

For this reason, the contactor 15 is set to be in a connection state by the "On" operation of the contactor relay 16, and the capacitor 11 and the battery 12 are connected in parallel with the starter magnet switch 18 and the starter motor 20 which are connected in series with each other. The starter motor 20 is then driven by the supply of power from the capacitor 11 and the battery 12.

Figure 2:
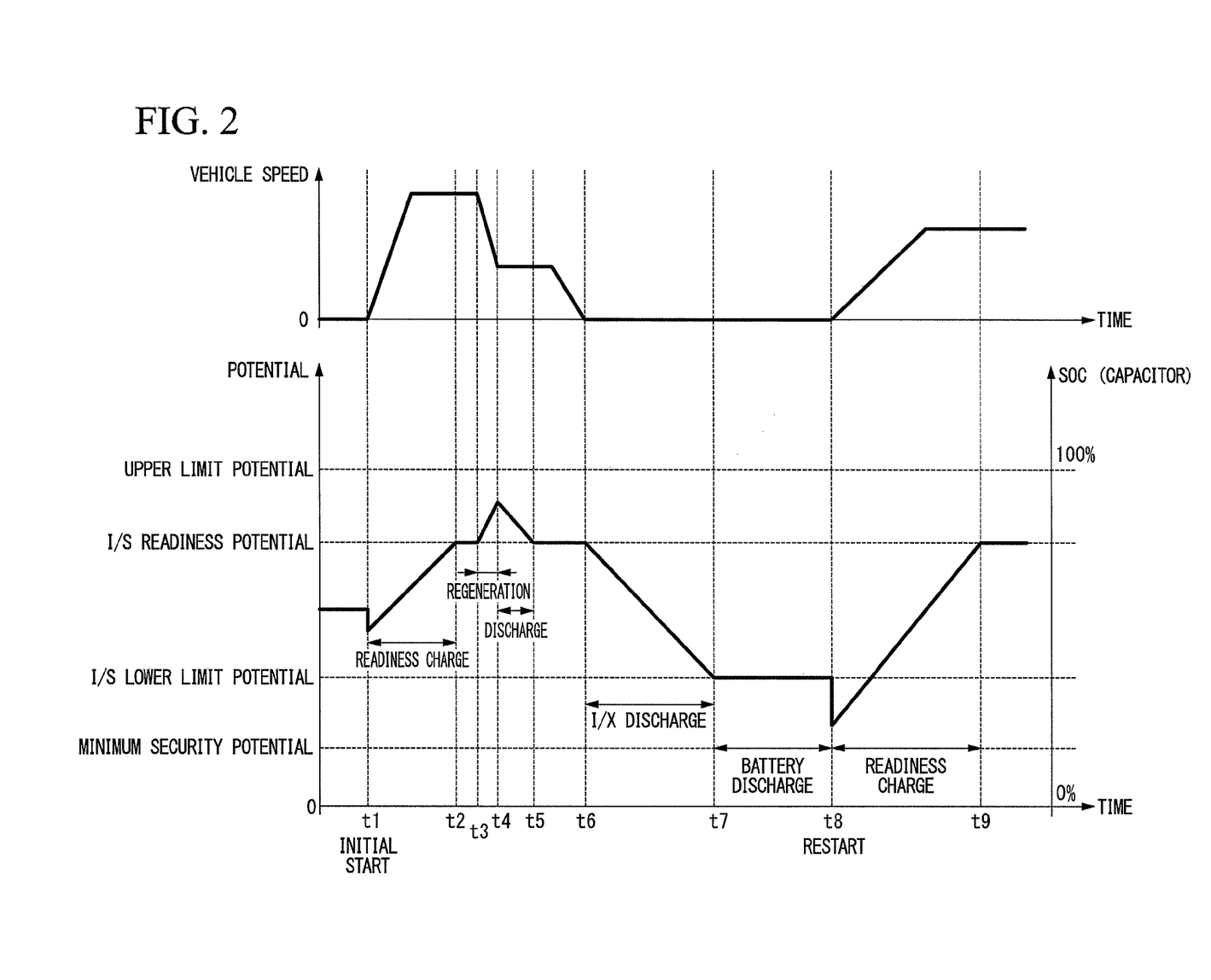
FIG. 2 is a diagram illustrating an example of a change in a terminal voltage of a capacitor based on an operating state of the vehicle to which the power supply degradation determination apparatus according to the embodiment of the invention is mounted.

In addition, in the initial start, for example, as at time t1 shown in FIG. 2, the terminal voltage (equivalent to, for example, a potential of a terminal on a positive electrode side with respect to a grounded terminal on a negative electrode side) of the capacitor 11 and the remaining capacity SOC drop due to the supply of power from the capacitor 11 to the starter motor 20.

Next, an operating mode M2 of I/S readiness charge is an operating mode in which power required for the restart of the internal combustion engine 22 is charged to the capacitor 11 in preparation for the execution of an idle stop. In this mode, for example, capacitor 11 is charged by supplying generative power, which is output from the generator 21 that generates power by motive power of the internal combustion engine 22 in an operating state, from the DC-DC converter 13 to the capacitor 11.

In this case, the contactor 15 is set to be in a cut-off state by the "Off" operation of the contactor relay 16, and, for example, as in the period from time t1 to time t2 shown in FIG. 2, the capacitor 11 is charged until at least the terminal voltage of the capacitor 11 reaches a predetermined I/S readiness potential.

In addition, the predetermined I/S readiness potential is, for example, a terminal voltage corresponding to the remaining capacity SOC capable of executing the required supply of power to the electric load 23 or the like in a temporary stop state of the internal combustion engine 22 over a predetermined period of time due to an idle stop.

In addition, in the period from time t1 to time t2 shown in FIG. 2, for example, the vehicle 1 maintains constant speed running after the vehicle is accelerated up to a predetermined vehicle speed by motive power of the internal combustion engine 22.

Next, an operating mode M3 of regeneration charge is an operating mode in which regenerative power which is output from the generator 21 during the deceleration of the vehicle 1 or the like is charged to the capacitor 11. In this mode, for example, the capacitor 11 is charged by supplying regenerative power, obtained by converting kinetic energy of a car body transmitted from driving wheels into electric energy (regenerative energy), through the DC-DC converter 13 to the capacitor 11.

In this case, the contactor 15 is set to be in a cut-off state by the "Off" operation of the contactor relay 16, and, for example, as in the period from time t3 to time t4 shown in FIG. 2, the capacitor 11 is charged in a range in which at least the terminal voltage of the capacitor 11 becomes a predetermined upper limit potential or less.

In addition, the predetermined upper limit potential is, for example, a terminal voltage corresponding to a full charge state (that is, remaining capacity SOC=100%).

Next, an operating mode M4 of regeneration discharge is an operating mode in which the capacitor 11 is discharged by supplying power, electrically accumulated in the capacitor 11 during constant speed running of the vehicle 1, or the like, to the electric load 23. In this mode, for example, the capacitor 11 is discharged by supplying regenerative power, electrically accumulated in excess of a predetermined I/S readiness potential, through the DC-DC converter 13 to the electric load 23.

In this case, the contactor 15 is set to be in a cut-off state by the "Off" operation of the contactor relay 16, and, for example, as in the period from time t4 to time t5 shown in FIG. 2, the capacitor 11 is discharged while halting the generation and regeneration of the generator 21 until at least the terminal voltage of the capacitor 11 reaches the predetermined I/S readiness potential.

Next, an operating mode M5 of I/S supply of power (capacitor) is an operating mode in which the capacitor 11 is discharged by supplying power, electrically accumulated in the capacitor 11 in a temporary stop state of the internal combustion engine 22 due to an idle stop of the vehicle 1, to the electric load 23. In this mode, for example, the capacitor 11 is discharged by supplying the power electrically accumulated in the capacitor 11 through the DC-DC converter 13 to the electric load 23 while securing power required for restarting the internal combustion engine 22 based on a return request.

In this case, the contactor 15 is set to be in a cut-off state by the "Off" operation of the contactor relay 16, and, for example, as in the period from time t6 to time t7 shown in FIG. 2, the capacitor 11 is discharged until at least the terminal voltage of the capacitor 11 reaches a predetermined VS lower limit potential.

In addition, the predetermined I/S lower limit potential is, for example, a terminal voltage corresponding to the remaining capacity SOC which is capable of executing an adequate supply of power required for restarting the internal combustion engine 22 in a temporary stop state by a driving force of the starter motor 20.

In addition, the adequate supply of power by the capacitor 11 means that the capacitor 11 is discharged so that the terminal voltage of the capacitor 11 does not drops to less than a predetermined minimum security potential.

Next, an operating mode M6 of I/S supply of power (BATT) is an operating mode in which the battery 12 is discharged by supplying power, electrically accumulated in the battery 12 in a temporary stop state of the internal combustion engine 22 due to an idle stop of the vehicle 1, to the electric load 23. In this mode, for example, discharge from the capacitor 11 in which minimum power required for restarting the internal combustion engine 22 based on a return request is secured is prohibited.

In this case, the contactor 15 is set to be in a cut-off state by the "Off" operation of the contactor relay 16, and, for example, as in the period from time t7 to time t8 shown in FIG. 2, the discharge of the capacitor 11 is prohibited so that at least the terminal voltage of the capacitor 11 maintains the predetermined I/S lower limit potential.

An operating mode M7 of ENG restart is an operating mode in which the internal combustion engine 22 is restarted based on a return request from a temporary stop state of an idle stop. The supply of power to the starter motor 20 through the starter magnet switch 18 is started by the "On" operation of the starter relay 19, and the internal combustion engine 22 is restarted by a driving force of the starter motor 20.

In this case, the contactor 15 is set to be in a cut-off state by the "Off" operation of the contactor relay 16, and the starter motor 20 is driven by the supply of power only from the capacitor 11 connected in parallel with the starter magnet switch 18 and the starter motor 20 which are connected in series with each other.

In this restart operation, for example, as at time t8 shown in FIG. 2, the terminal voltage and the remaining capacity SOC of the capacitor 11 drop due to the supply of power from the capacitor 11 to the starter motor 20, but the terminal voltage is set so as not to drop to less than the predetermined minimum security potential.

After the restart of the internal combustion engine 22, for example, like that after time t8 shown in FIG. 2, the above-mentioned operating mode M2 of I/S readiness charge is executed, and the vehicle 1 is accelerated by motive power of the internal combustion engine 22.

Incidentally, the above-mentioned predetermined I/S lower limit potential changes according to the state (for example, the internal resistance, the degree of degradation and the like depending on temperature) of the capacitor 11.

Figure 3:
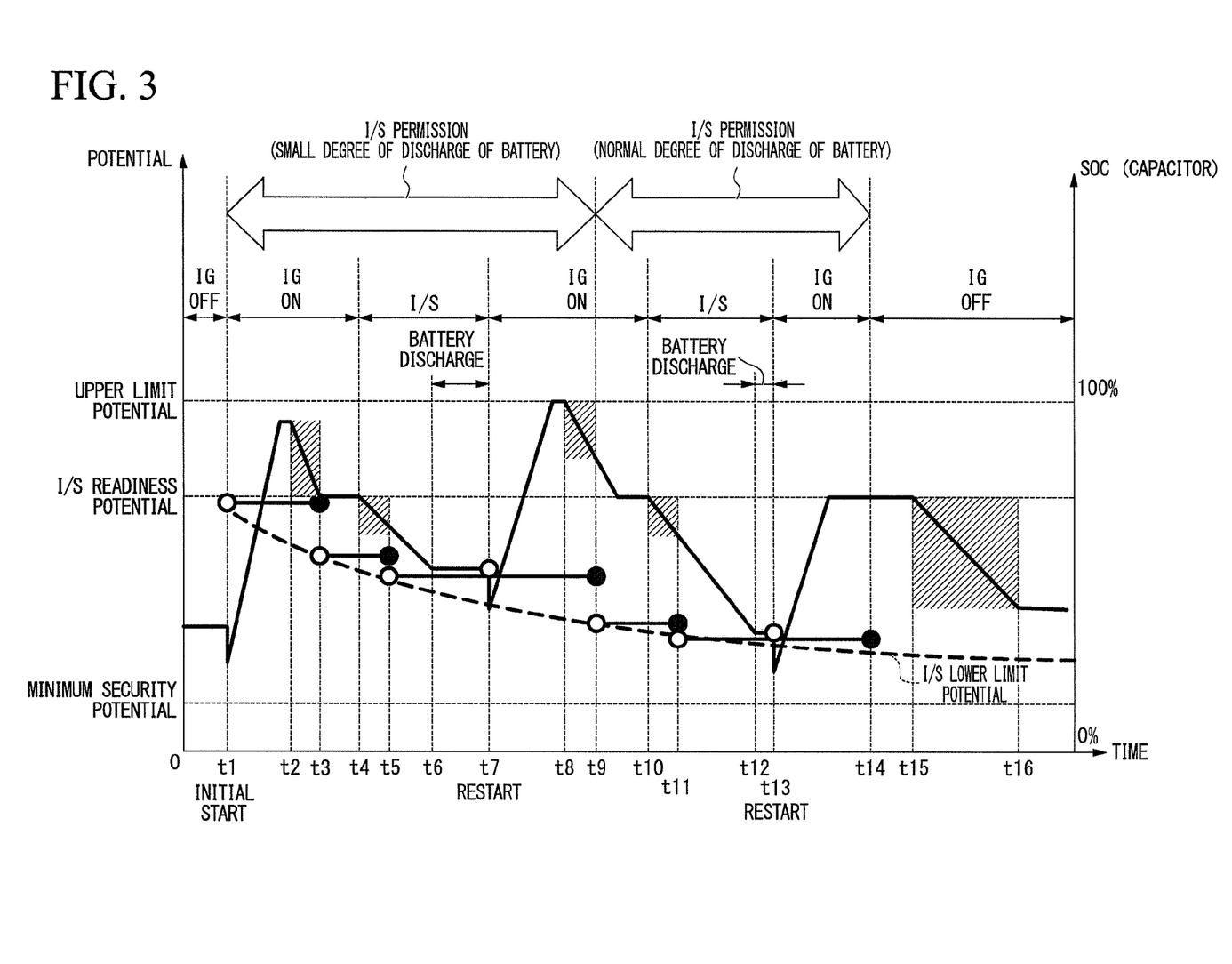
FIG. 3 is a diagram illustrating an example of a change in the terminal voltage of the capacitor based on an operating state of the vehicle to which the power supply degradation determination apparatus according to the embodiment of the invention is mounted.

For this reason, for example, as shown in FIG. 3, the controller 14 detects the internal resistance of the capacitor 11, and updates the I/S lower limit potential based on the detection result.

The controller 14 detects the internal resistance of the capacitor 11, for example, using the difference between the terminal voltage and the open circuit voltage of the capacitor 11 during the execution of a discharge phase in which the capacitor 11 is discharged, and the discharge current of the capacitor 11 during the execution of the discharge phase.

For example, referring to data or the like indicating a predetermined correspondence relationship between the internal resistance and the I/S lower limit potential which are stored in advance, the I/S lower limit potential based on the detected internal resistance is acquired, a current I/S lower limit potential is updated by the newly acquired I/S lower limit potential, and an updated result thereof is maintained until the next update.

First, for example, in the initial start of the internal combustion engine 22 concomitant with the "On" operation of the ignition switch (IGON) at time t1 shown in FIG. 3, the controller 14 sets a predetermined lower limit potential initial value as the VS lower limit potential.

The lower limit potential initial value may be, for example, a value based on the temperature, the internal resistance, the degree of degradation and the like of the capacitor 11 ascertained at this point in time, and may be a predetermined fixed value. For example, when the internal resistance is high due to the low temperature of the capacitor 11, the predetermined lower limit potential initial value becomes a high value in order to secure power required for starting the internal combustion engine 22.

After time t2 of FIG. 3 at which the discharge (for example, operating mode M4 of regeneration discharge) of the capacitor 11 is started after the start of the internal combustion engine 22, the controller 14 detects the terminal voltage and the discharge current of the capacitor 11 over a predetermined time. The internal resistance of the capacitor 11 is then detected based on a detection result thereof, and the I/S lower limit potential based on the detected internal resistance is acquired. For example, as shown in time t3 of FIG. 3, a current I/S lower limit potential is updated by the newly acquired I/S lower limit potential.

After time t4 of FIG. 3, for example, at which the execution of an idle stop and the discharge of the capacitor 11 (for example, operating mode M5 of I/S supply of power (capacitor)) are started after the I/S lower limit potential is updated, the controller 14 detects the terminal voltage and the discharge current of the capacitor 11 over a predetermined time. The internal resistance of the capacitor 11 is then detected based on a detection result thereof, and the I/S lower limit potential based on the detected internal resistance is acquired. For example, as shown at time t5 of FIG. 3, a current I/S lower limit potential is updated by the newly acquired I/S lower limit potential.

After time t5 of FIG. 3 at which the terminal voltage of the capacitor 11 reaches the I/S lower limit potential along with the continuation of the discharge of the capacitor 11 (for example, operating mode M5 of I/S supply of power (capacitor)) during the execution of an idle stop after the update of the I/S lower limit potential, the controller 14 stops the discharge of the capacitor 11 (for example, operating mode M5 of I/S supply of power (capacitor)), and starts the discharge of the battery 12 (for example, operating mode M6 of I/S supply of power (BATT)).

For example, after time t8 of FIG. 3 at which the discharge of the capacitor 11 (for example, operating mode M4 of regeneration discharge) is started after the internal combustion engine 22 is automatically restarted based on a return request at time t7 of FIG. 3, the controller 14 detects the terminal voltage and the discharge current of the capacitor 11 over a predetermined time. The internal resistance of the capacitor 11 is then detected based on a detection result thereof, and the I/S lower limit potential based on the detected internal resistance is acquired. For example, as shown at time t9 of FIG. 3, a current I/S lower limit potential is updated by the newly acquired I/S lower limit potential.

After time t10 of FIG. 3, for example, at which the execution of an idle stop and the discharge of the capacitor 11 (for example, operating mode M5 of I/S supply of power (capacitor)) are started after the I/S lower limit potential is updated, the controller 14 detects the terminal voltage and the discharge current of the capacitor 11 over a predetermined time. The internal resistance of the capacitor 11 is then detected based on a detection result thereof, and the I/S lower limit potential based on the detected internal resistance is acquired. For example, as shown at time t11 of FIG. 3, a current I/S lower limit potential is updated by the newly acquired I/S lower limit potential.

After time t12 of FIG. 3 at which the terminal voltage of the capacitor 11 reaches the I/S lower limit potential along with the continuation of the discharge of the capacitor 11 (for example, operating mode M5 of I/S supply of power (capacitor)) during the execution of an idle stop after the update of the I/S lower limit potential, the controller 14 stops the discharge of the capacitor 11 (for example, operating mode M5 of I/S supply of power (capacitor)) and starts the discharge of the battery 12 (for example, operating mode M6 of I/S supply of power (BATT)).

After the internal combustion engine 22 is automatically restarted based on a return request, for example, at time t13 of FIG. 3, and the internal combustion engine 22 is stopped along with the "Off" operation of the ignition switch (IG-OFF) at time t14 shown in FIG. 3, and further after time t15 of FIG. 3 at which the discharge of the capacitor 11 is started, the controller 14 continuously detects the terminal voltage and the discharge current of the capacitor 11. The internal resistance of the capacitor 11 is then detected based on a detection result thereof, and the degree of degradation of the capacitor 11 is determined based on the detected internal resistance.

For example, as shown in FIG. 3, when the internal resistance drops due to a rise in the temperature of the capacitor 11 after the start of the internal combustion engine 22, the I/S lower limit potential is updated to a lower value, and the duration time (that is, time required for the terminal voltage of the capacitor 11 to drop from the predetermined I/S readiness potential to the I/S lower limit potential) of the discharge of the capacitor 11 (that is, operating mode M5 of I/S supply of power (capacitor)) during the execution of an idle stop lengthens.

Therefore, for example, when the internal resistance of the capacitor 11 increases, the duration time of the discharge of the battery 12 (that is, operating mode M6 of I/S supply of power (BATT)) lengthens within the period of duration of an idle stop over a predetermined time.

Thereby, for example, when the execution permission of an idle stop is output in a case where the internal resistance of the capacitor 11 is determined to be less than a predetermined value, the controller 14 supplies power from the battery 12 to the electric load 23 with a normal predetermined depth of discharge.

On the other hand, for example, when the execution permission of an idle stop is output in a case where the internal resistance of the capacitor 11 is determined to be a predetermined value or more, the controller supplies power from the battery 12 to the electric load 23 with a smaller depth of discharge than the normal predetermined depth of discharge.

In addition, for example, when the internal resistance of the capacitor 11 is determined to be a predetermined value or more, the controller 14 makes the supply of power from the capacitor 11 to the electric load 23 smaller than when the internal resistance of the capacitor 11 is determined to be less than the predetermined value.

In addition, when the internal resistance of the capacitor 11 is determined to be a predetermined value or more, the controller 14 delays the execution start of the next discharge phase for a predetermined time (predetermined standby time).

Figure 4:
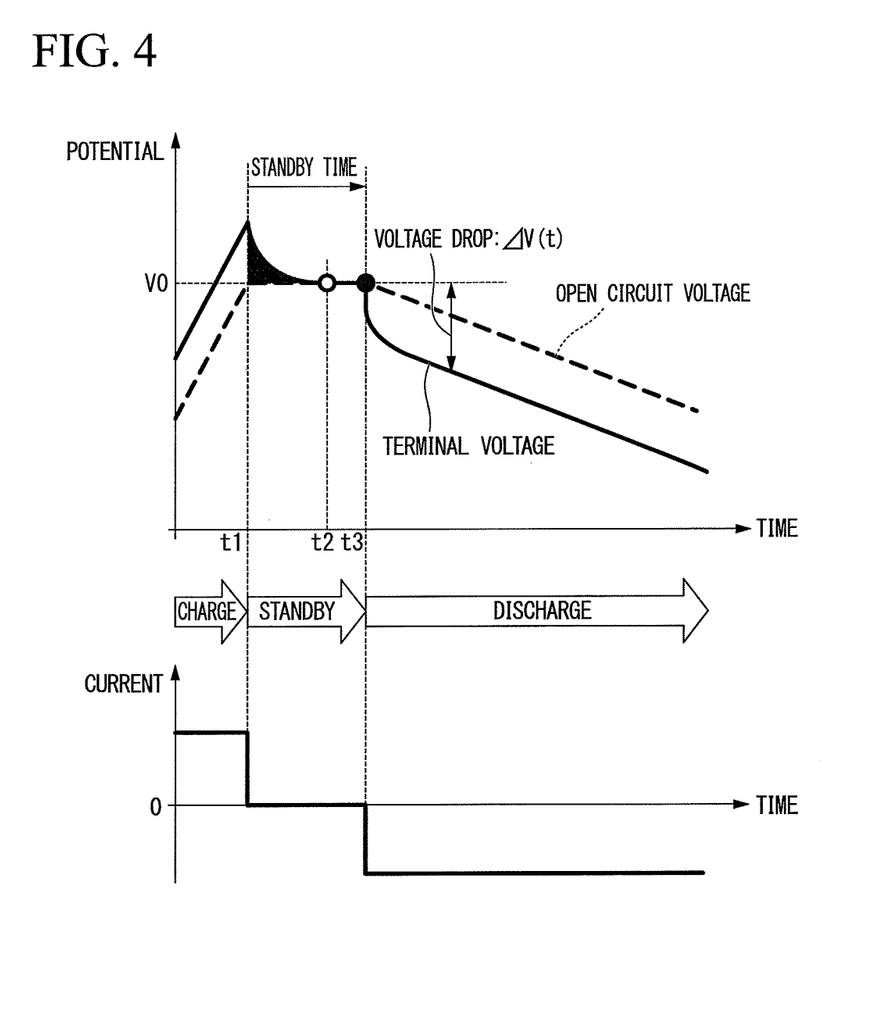
FIG. 4 is a diagram illustrating an example of a change in a voltage and a current of a terminal of the capacitor of the power supply degradation determination apparatus according to the embodiment of the invention.

For example, as shown in FIG. 4, only when the execution of a discharge phase is started within a predetermined time after the execution of a charge phase is terminated in a case where the discharge phase is executed subsequent to the execution of the charge phase in which the capacitor 11 is charged, the controller 14 delays the execution start of the discharge phase for a predetermined time.

For example, when the internal resistance of the capacitor 11 is determined to be a predetermined value or more in a case where the execution start of the discharge phase is scheduled within a predetermined time after the execution of the charge phase at time t1 shown in FIG. 4 is stopped, the controller 14 delays the execution start of the discharge phase for a predetermined standby time.

In this standby time, since the charge and discharge of the capacitor 11 is stopped, the open circuit voltage of the capacitor 11 becomes a predetermined constant value, whereas the terminal voltage of the capacitor 11 changes so as to converge toward the open circuit voltage. Thus, the difference between the terminal voltage and the open circuit voltage of the capacitor 11 decreases.

Thereby, for example, when the execution of the discharge phase is started at time t3 when the predetermined standby time elapses from time t1 of FIG. 4 at which the execution of the charge phase is stopped, the controller 14 sets a terminal voltage V0 of the capacitor 11, detected at time t2 immediately before the execution start of the discharge phase, to the open circuit voltage of the capacitor 11.

The internal resistance of the capacitor 11 is detected using the difference between (that is, voltage drop $\Delta V(t)$) between the terminal voltage of the capacitor 11 detected at an appropriate timing t during the execution of the discharge phase executed after time t3 of FIG. 4 and the open circuit voltage (that is, terminal voltage V0) of the capacitor 11 detected in the standby time, and the discharge current of the capacitor 11 during the execution of the discharge phase.

Figure 5:
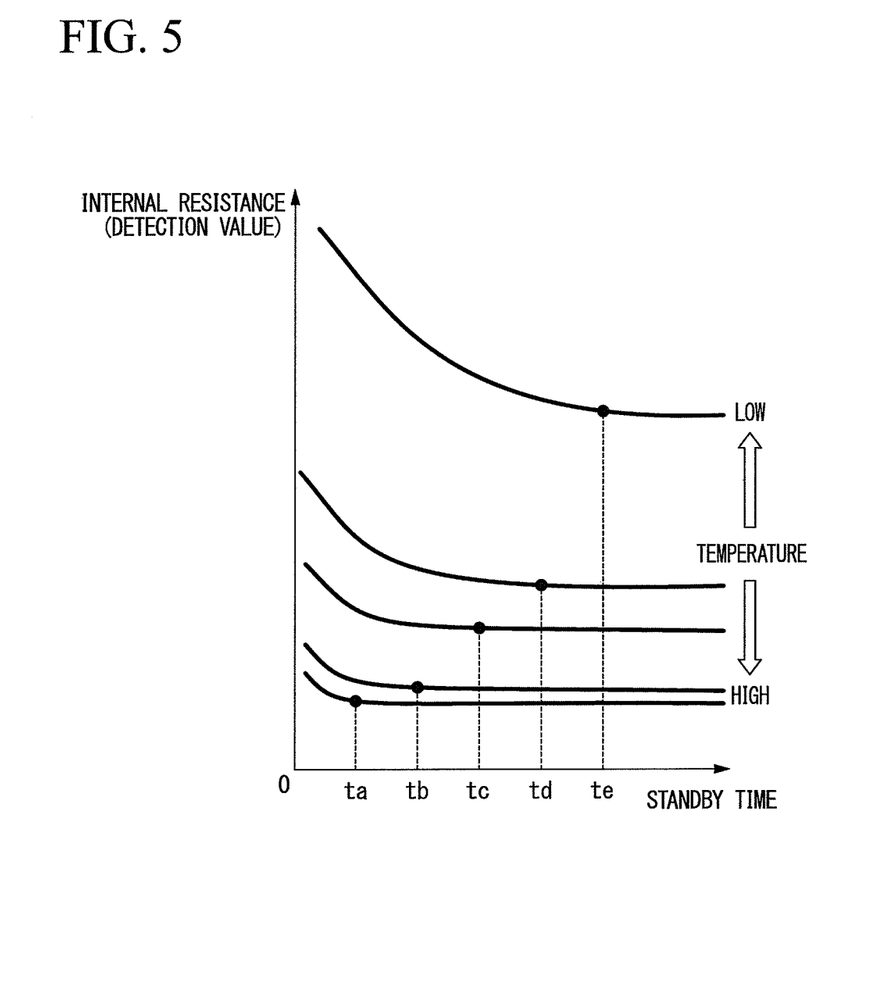
FIG. 5 is a diagram illustrating an example of a change in an internal resistance based on a standby time of the capacitor of the power supply degradation determination apparatus according to the embodiment of the invention.

In addition, for example, as shown in FIG. 5, the controller 14 increases the standby time for the execution start of the next discharge phase with an increase in the detected internal resistance of the capacitor 11, based on an increase in the standby time of ta to te (that is, time required for the terminal voltage to be stabilized by causing the terminal voltage to converge toward the open circuit voltage when the charge and discharge of the capacitor 11 are stopped) required for the detection value of the internal resistance to stably converge, in addition to an increase in the internal resistance of the capacitor 11 with a decrease in the temperature of the capacitor 11.

In addition, for example, the controller 14 prohibits the execution start of the discharge phase from being delayed for a predetermined time until the internal resistance of the capacitor 11 is determined to be a predetermined value or more.

Figure 6:
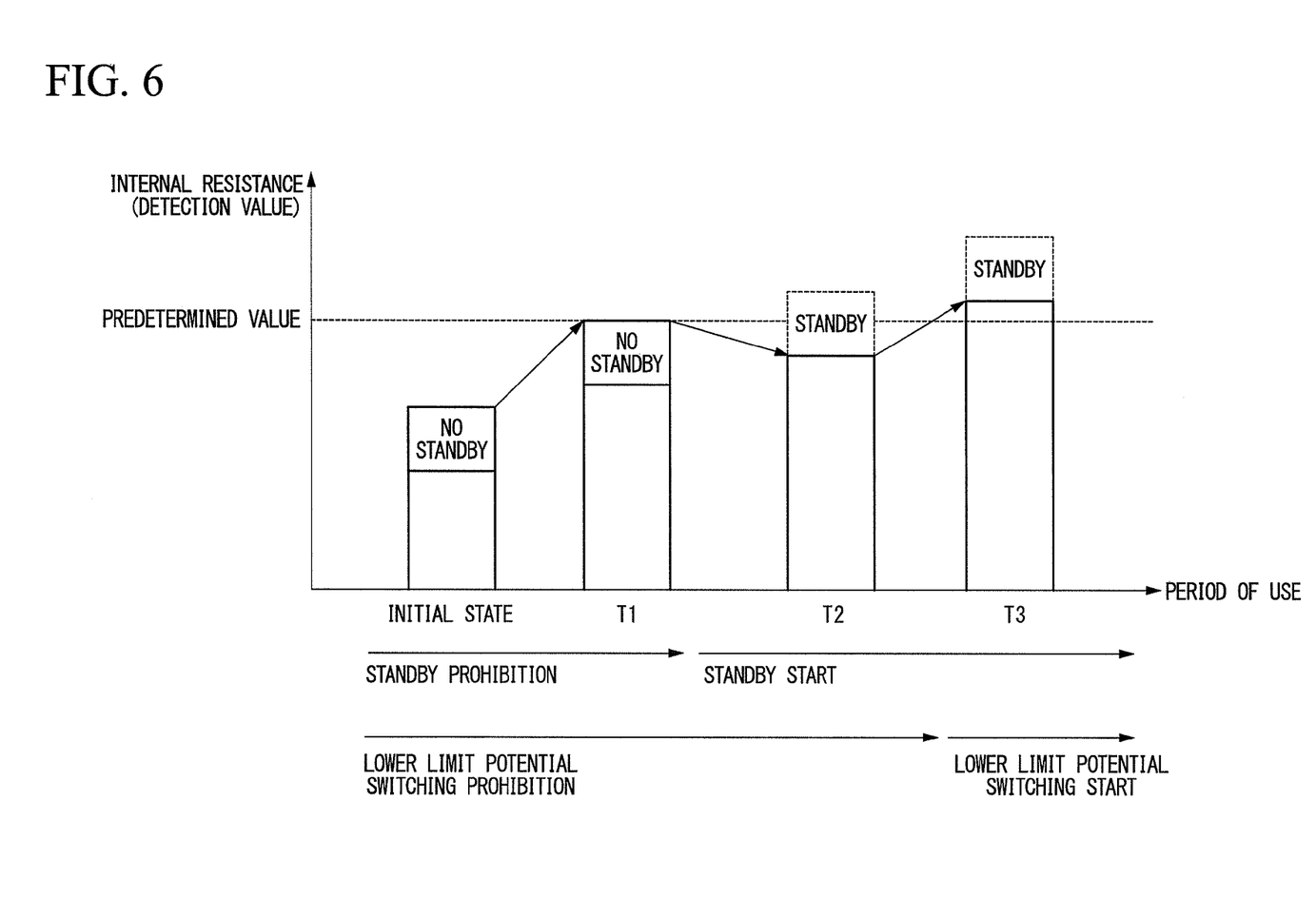
FIG. 6 is a diagram illustrating an example of a change in the internal resistance and timings of a standby start and a lower limit potential switching start which are based on a period of use of the capacitor of the power supply degradation determination apparatus according to the embodiment of the invention.

For example, as shown in FIG. 6, when the detection value of the internal resistance is less than a predetermined value as in the initial state where the degradation of the capacitor 11 is not present, at the ordinary temperature of the capacitor 11, or the like, the controller 14 prohibits (prohibits standby) the execution start of the discharge phase from being delayed for a predetermined time.

When the detection value of the internal resistance becomes a predetermined value or more in a state where standby prohibition is executed with an increase in the internal resistance due to the lengthening of the period of use of the capacitor 11, for example, like that after the elapse of a period of use T1 shown in FIG. 6, the controller 14 starts (starts standby) delaying the execution start of the next discharge phase for a predetermined time.

Even when the detection value of the internal resistance becomes less than the predetermined value along with the execution of the standby start, for example, like that after the elapse of a period of use T2 shown in FIG. 6, the controller 14 continues the execution of the standby start.

In addition, the controller 14 prohibits the update of the I/S lower limit potential based on the internal resistance, for example, until the detection value of the internal resistance becomes the predetermined value or more in a state where the standby start is executed, and may execute the update of the I/S lower limit potential based on the internal resistance when the detection value of the internal resistance becomes the predetermined value or more in a state where the standby start is executed, for example, like that after the elapse of a period of use T3 shown in FIG. 6.

As mentioned above, according to the power supply degradation determination apparatus 10 of the present embodiment, when the internal resistance of the capacitor 11 is determined to be the predetermined value or more, the execution start of the next discharge phase is delayed for the predetermined time, thereby allowing the internal resistance to be detected with a high level of accuracy in a state where the terminal voltage of the capacitor 11 is stable.

Furthermore, since the internal resistance is detected by delaying the execution start of the discharge phase, regenerative energy of the vehicle 1 capable of being recovered as electric energy is prevented from being reduced, for example, as compared to the case where the internal resistance is detected by delaying the execution start of the charge phase, and thus the fuel efficiency of the vehicle 1 can be prevented from dropping.

Further, in a state where switching from the charge phase to the discharge phase is performed, the difference between the terminal voltage and the open circuit voltage of the capacitor 11 is large, and the time required for the terminal voltage to stabilize lengthens. Thereby, the internal resistance is easily detected as a higher value than in reality in addition to an increase in a detection error of the internal resistance, and thus the degradation of the capacitor 11 can be determined early.

On the other hand, the execution start of the discharge phase is delayed for at least the predetermined time, and standby is performed until the terminal voltage stabilizes so that the difference between the terminal voltage and the open circuit voltage of the capacitor 11 is made to be small, thereby allowing the detection accuracy of the internal resistance to be improved.

Further, since the standby time for the execution start of the next discharge phase is increased with an increase in the internal resistance of the capacitor 11, the execution start of the discharge phase is prevented from being excessively delayed when the internal resistance is small. Thereby, it is possible to secure a desired supply of power to the electric load 23 and the like and to prevent the detection accuracy of the internal resistance from dropping when the internal resistance is large.

Further, since the execution of standby that delaying the execution start of the discharge phase for at least a predetermined time is prohibited until the internal resistance of the capacitor 11 is determined to be a predetermined value or more, the execution of standby is omitted with respect to the capacitor 11 in a low temperature state, for example, during the start of the vehicle 1, or the like. Thereby, it is possible to early perform the execution start of the discharge phase and the determination of the internal resistance, and to prevent the execution start of the discharge phase and the determination of the internal resistance from being delayed unnecessarily.

Further, the depth of discharge of the battery 12 is reduced with an increase in the internal resistance of the capacitor 11, thereby allowing the battery 12 to be prevented from being degraded.

Further, since the supply of power from the capacitor 11 to the electric load 23 is made to be smaller when the internal resistance of the capacitor 11 is determined to be a predetermined value or more, than when the internal resistance thereof is determined to be less than the predetermined value, it is possible to secure the supply of power to the electric load 23 over a desired idle stop time.

In addition, in the above-mentioned embodiment, the controller 14 may make a predetermined time (predetermined standby time) when the discharge phase is executed subsequent to the execution of the discharge phase, for example, longer than a predetermined time (predetermined standby time) when the discharge phase is executed subsequent to the execution of the charge phase.

Figures 7A, 7B:
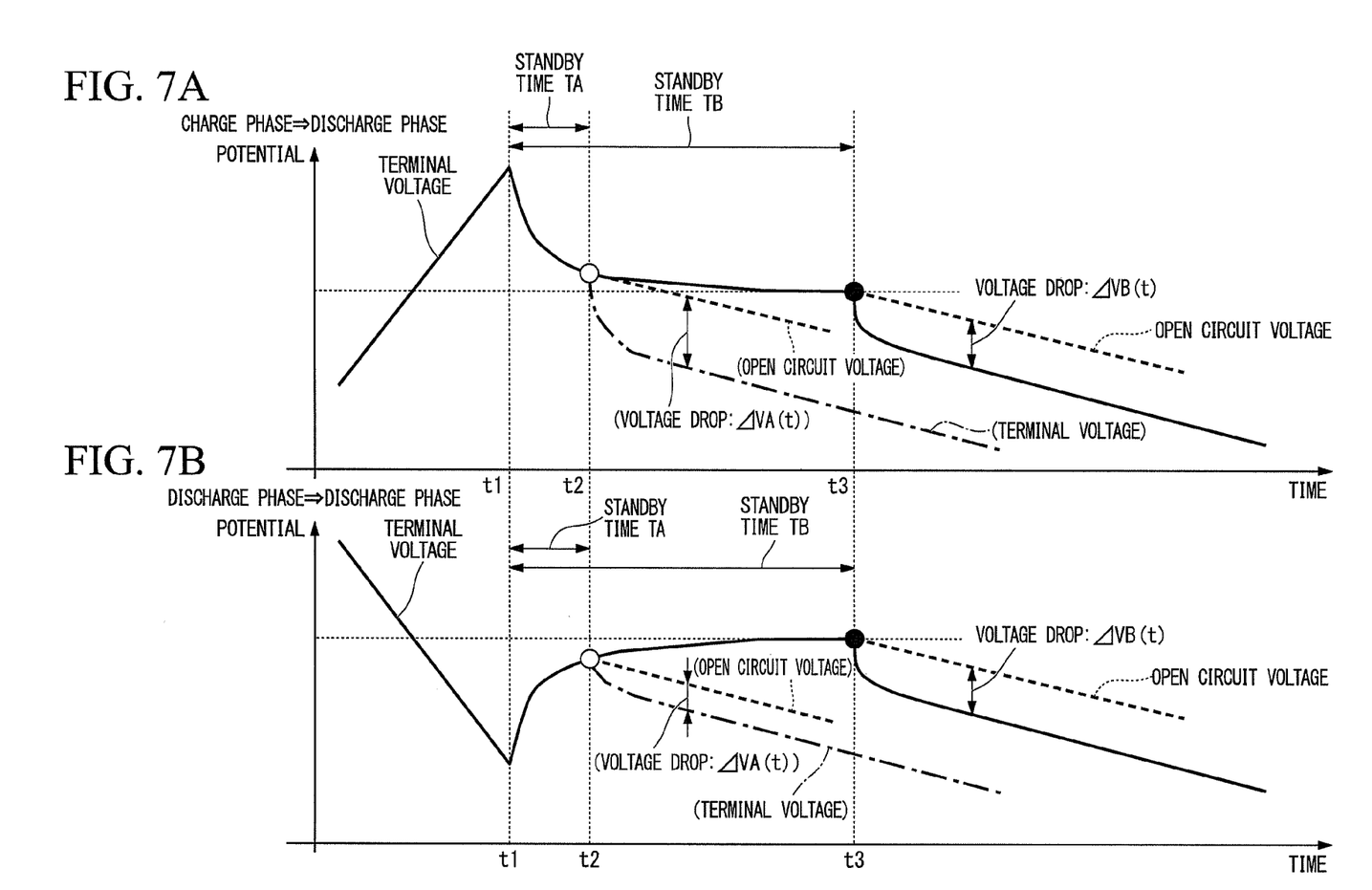
FIG. 7A is diagrams illustrating an example of a change in the terminal voltage of the capacitor when a discharge phase is executed subsequent to the execution of a charge phase and when a discharge phase is executed subsequent to the execution of a discharge phase, in the power supply degradation determination apparatus according to the embodiment of the invention.
FIG. 7B is diagram illustrating an example of a change in the terminal voltage of the capacitor when a discharge phase is executed subsequent to the execution of a charge phase and when a discharge phase is executed subsequent to the execution of a discharge phase, in the power supply degradation determination apparatus according to the embodiment of the invention.

For example, as shown in FIG. 7A, in a case where the discharge phase is executed subsequent to the execution of the charge phase before time t1, an error occurs in which a voltage drop $\Delta VA(t)$ (that is, difference between the open circuit voltage and the terminal voltage) when the discharge is started after the elapse (for example, at time t2) of a short standby time TA becomes higher than a voltage drop $\Delta VB(t)$ when the discharge is started after the elapse (for example, at time t3) of a sufficiently long standby time TB.

For this reason, when the discharge is started before the sufficiently long standby time TB elapses, the internal resistance is easily detected as a higher value than in reality, and thus the degradation of the capacitor 11 can be determined early.

On the other hand, for example, as shown in FIG. 7B, in a case where the discharge phase is executed subsequent to the execution of the discharge phase before time t1, an error occurs in which the voltage drop $\Delta VA(t)$ (that is, difference between the open circuit voltage and the terminal voltage) when the discharge is started after the elapse (for example, at time t2) of the short standby time TA becomes lower than the voltage drop $\Delta VB(t)$ when the discharge is started after the elapse (for example, at time t3) of the sufficiently long standby time TB.

For this reason, when the discharge is started before the sufficiently long standby time TB elapses, the internal resistance is easily detected as a lower value than in reality, and thus it is difficult to determine the degradation of the capacitor 11.

Therefore, when the discharge phase is executed subsequent to the execution of the discharge phase, the degradation of the capacitor 11 is prevented from not being detected by making the predetermined time required for standby longer than when the discharge phase is executed subsequent to the execution of the charge phase, and thus the degradation of the capacitor 11 can be determined accurately.

In addition, in the above-mentioned embodiment, the controller 14 may supply power from the capacitor 11 to the electric load 23, for example, during the execution of the discharge phase, and may supply power from the battery 12 to the electric load 23 with the depth of discharge smaller than the predetermined depth of discharge when the capacitor 11 is determined to be degraded in a state where standby prohibition is not executed.

In addition, in the above-mentioned embodiment, for example, the controller 14 may determine that the capacitor 11 is degraded when the internal resistance is the predetermined value or more.

In addition, in the above-mentioned embodiment, for example, only when the execution of the discharge phase is started within the predetermined time after the execution of the charge phase is terminated in a case where the discharge phase is executed subsequent to the execution of the charge phase, the controller 14 detects the internal resistance of the capacitor 11 using the difference between the terminal voltage and the open circuit voltage of the capacitor 11 during the execution of the discharge phase and the discharge current of the capacitor 11 during the execution of the discharge phase, and may determine whether the internal resistance is the predetermined value or more.

In this case, in a state where switching from the charge phase to the discharge phase is performed, the difference between the terminal voltage and the open circuit voltage of the capacitor 11 is large, and the time required for the terminal voltage to stabilize lengthens. Thereby, the internal resistance is easily detected as a higher value than in reality in addition to an increase in a detection error of the internal resistance, and thus the degradation of the capacitor 11 can be determined early.

In addition, in the above-mentioned embodiment, for example, when an instruction is given to prohibit the execution of the idle stop of the vehicle 1 based on the operation or the like of a driver, or when the idle stop is not able to be executed due to an abnormality of an idle stop function of the vehicle 1, or the like, the controller 14 may not execute a process of delaying the execution start of the discharge phase for the predetermined time in order to detect the internal resistance of the capacitor 11.

In addition, in the above-mentioned embodiment, when the power supply degradation determination apparatus 10 includes, for example, a notification apparatus using a display or a sound output, and the controller 14 determines that the capacitor 11 is degraded, notification for promoting the replacement of the capacitor 11 may be performed by the notification apparatus together with the determination result.

What is claimed is:

1. A power supply degradation determination apparatus which is mounted to a vehicle, comprising:
a battery which is capable of accumulating regenerative energy of the vehicle;
an electric load which is connected to the battery;
a charge and discharge control unit configured to control execution of a charge phase in which the battery is charged and a discharge phase in which the battery is discharged;
a standby unit configured to delay an execution start of the discharge phase by the charge and discharge control unit for a predetermined time; and
an internal resistance determination unit configured to determine an internal resistance of the battery,
wherein the internal resistance determination unit is configured to detect the internal resistance of the battery using a difference between a terminal voltage and an open circuit voltage of the battery during the execution of the discharge phase, and a discharge current of the battery during the execution of the discharge phase, and to determine whether the internal resistance is a predetermined value or more, and
the standby unit is configured to delay the execution start of the discharge phase by the charge and discharge control unit for the predetermined time while stopping the charge and discharge of the battery, when the internal resistance is determined to be the predetermined value or more by the internal resistance determination unit.

2. The power supply degradation determination apparatus according to claim 1, wherein the standby unit is configured to delay the execution start of the discharge phase for the predetermined time only when the execution of the discharge phase is started within the predetermined time after the execution of the charge phase is terminated in a case where the discharge phase is executed subsequent to the execution of the charge phase by the charge and discharge control unit.

3. The power supply degradation determination apparatus according to claim 1, wherein the standby unit is configured to increase the predetermined time with an increase in the internal resistance detected by the internal resistance determination unit.

4. The power supply degradation determination apparatus according to claim 1, wherein the standby unit is configured to make the predetermined time when the discharge phase is executed subsequent to the execution of the discharge phase by the charge and discharge control unit longer than the predetermined time when the discharge phase is executed subsequent to the execution of the charge phase by the charge and discharge control unit.

5. The power supply degradation determination apparatus according to claim 1, further comprising a standby prohibition unit configured to prohibit the execution start of the discharge phase by the charge and discharge control unit from being delayed for the predetermined time by the standby unit until the internal resistance is determined to be the predetermined value or more by the internal resistance determination unit.

6. The power supply degradation determination apparatus according to claim 5, wherein the vehicle is equipped with an internal combustion engine that drives the vehicle, the electric load, and a battery capable of supplying power to the electric load with a predetermined depth of discharge, the charge and discharge control unit is configured to supply power from the battery to the electric load during the execution of the discharge phase, and the charge and discharge control unit is configured to supply power from the battery to the electric load with a depth of discharge smaller than the predetermined depth of discharge, when the internal resistance is determined to be the predetermined value or more by the internal resistance determination unit in a state where standby prohibition by the standby prohibition unit is not executed.

7. The power supply degradation determination apparatus according to claim 6, wherein the vehicle includes an idle stop unit configured to temporarily stop the internal combustion engine when stop conditions are satisfied and to start the internal combustion engine in a temporary stop state when return conditions are satisfied, the battery holds power required for starting the internal combustion engine, the idle stop unit supplies the power from the battery to a start-up device of the internal combustion engine based on a return request, and the charge and discharge control unit is configured to make a supply of power from the battery to the electric load smaller when the internal resistance is determined to be the predetermined value or more by the internal resistance determination unit than when the internal resistance is determined to be less than the predetermined value by the internal resistance determination unit.

8. A power supply degradation determination apparatus which is mounted to a vehicle, comprising:

a battery which is capable of accumulating regenerative energy of the vehicle;

a charge and discharge control unit configured to control execution of a charge phase in which the battery is charged and a discharge phase in which the battery is discharged; and an internal resistance determination unit configured to determine an internal resistance of the battery, wherein the internal resistance determination unit is configured to detect the internal resistance of the battery using a difference between a terminal voltage and an open circuit voltage of the battery during the execution of the discharge phase and a discharge current of the battery during the execution of the discharge phase, only when the execution of the discharge phase is started within a predetermined time after the execution of the charge phase is terminated in a case where the discharge phase is executed subsequent to the execution of the charge phase by the charge and discharge control unit and to determine whether the internal resistance is a predetermined value or more.

\* \* \* \* \*